(12) United States Patent
Schriever

(10) Patent No.: US 6,998,620 B2
(45) Date of Patent: Feb. 14, 2006

(54) STABLE ENERGY DETECTOR FOR EXTREME ULTRAVIOLET RADIATION DETECTION

(75) Inventor: Guido Schriever, Goettingen (DE)

(73) Assignee: Lambda Physik AG, Goettingen (DE)

(*) Notice: Subject to any disclaimer, the term of this patent is extended or adjusted under 35 U.S.C. 154(b) by 274 days.

(21) Appl. No.: 10/218,690

(22) Filed: Aug. 12, 2002

(65) Prior Publication Data

US 2003/0058429 A1 Mar. 27, 2003

Related U.S. Application Data

(60) Provisional application No. 60/312,277, filed on Aug. 13, 2001.

(51) Int. Cl.
*G21K 1/00* (2006.01)
*G01J 1/42* (2006.01)

(52) U.S. Cl. .................................. 250/372; 250/505.1
(58) Field of Classification Search ............ 378/34, 378/36, 43, 84, 85, 98.8, 119, 145, 156–159; 250/372, 504 R, 505.1, 363, 492.2
See application file for complete search history.

(56) References Cited

U.S. PATENT DOCUMENTS

| | | | |
|---|---|---|---|
| 4,009,933 A | 3/1977 | Firester | 350/152 |
| 4,240,044 A | 12/1980 | Fahlen et al. | 331/94.5 PE |
| 4,380,079 A | 4/1983 | Cohn et al. | 372/87 |
| 4,393,505 A | 7/1983 | Fahlen | 372/57 |
| 4,399,540 A | 8/1983 | Bücher | 372/20 |
| 4,611,270 A | 9/1986 | Klauminzer et al. | 364/183 |
| 4,616,908 A | 10/1986 | King | 350/576 |
| 4,674,099 A | 6/1987 | Turner | 372/59 |
| 4,686,682 A | 8/1987 | Haruta et al. | 372/87 |
| 4,691,322 A | 9/1987 | Nozue et al. | 372/82 |

(Continued)

FOREIGN PATENT DOCUMENTS

| | | |
|---|---|---|
| DE | 295202 80 | 12/1995 |
| DE | 298 22 090 U1 | 12/1998 |
| EP | 0 236 137 A2 | 3/1987 |
| EP | 0 532 751 A1 | 2/1991 |
| EP | 0 532 751 B1 | 2/1991 |
| EP | 0 459 503 A2 | 5/1991 |
| EP | 0 459 503 A3 | 5/1991 |
| EP | 0 790 681 A2 | 1/1997 |
| EP | 0 867 774 A2 | 3/1998 |
| EP | 0 867 774 A3 | 3/1998 |
| EP | 0 987 601 A2 | 3/2000 |
| JP | 63-86593 | 4/1988 |
| JP | HEI 1-115182 | 5/1989 |
| JP | HEI 3-166784 | 7/1991 |
| JP | HEI 3-265180 | 11/1991 |
| JP | HEI 4-17380 | 1/1992 |
| WO | WO 99/19952 | 4/1999 |
| WO | WO 01/01532 A1 | 1/2001 |

OTHER PUBLICATIONS

L.R. Canfield et al., "Stability and quantum efficiency performance of silicon photodiode detectors in the far ultraviolet," *Applied Optics*, vol. 28, No. 18, Sep. 15, 1989, pp. 3940–3943.

(Continued)

*Primary Examiner*—Allen C. Ho
(74) *Attorney, Agent, or Firm*—Stallman & Pollock LLP

(57) ABSTRACT

A detector for use with an EUV photon source emitting around 11–15 nm includes at least one multilayer mirror for reflecting the beam along an optical path include a detector element, a filter for reducing the bandwidth of the beam, and the detector element. The detector element preferably comprises a Si pn diodes with doped dead region and zero surface recombination or PtSi-nSi barrier for increasing the long term stability of the detector.

18 Claims, 7 Drawing Sheets

U.S. PATENT DOCUMENTS

| | | | |
|---|---|---|---|
| 4,719,637 A | 1/1988 | Cavaioli et al. | 372/59 |
| 4,829,536 A | 5/1989 | Kajiyama et al. | 372/57 |
| 4,835,580 A * | 5/1989 | Havemann et al. | 257/478 |
| 4,856,018 A | 8/1989 | Nozue et al. | 372/98 |
| 4,860,300 A | 8/1989 | Bäumler et al. | 372/57 |
| 4,891,818 A | 1/1990 | Levatter | 372/57 |
| 4,905,243 A | 2/1990 | Lokai et al. | 372/32 |
| 4,926,428 A | 5/1990 | Kajiyama et al. | 372/20 |
| 4,953,174 A | 8/1990 | Eldridge et al. | 372/83 |
| 4,975,919 A | 12/1990 | Amada et al. | 372/33 |
| 5,001,721 A | 3/1991 | Ludewig et al. | 372/59 |
| 5,005,181 A | 4/1991 | Yoshioka et al. | 372/59 |
| 5,025,445 A | 6/1991 | Anderson et al. | 372/20 |
| 5,051,558 A | 9/1991 | Sukhman | 219/121.68 |
| 5,081,635 A | 1/1992 | Wakabayashi et al. | 372/57 |
| 5,095,492 A | 3/1992 | Sandstrom | 372/102 |
| 5,099,491 A | 3/1992 | Chaffee | 372/59 |
| 5,111,473 A | 5/1992 | Rebhan et al. | 372/59 |
| 5,136,605 A | 8/1992 | Basting et al. | 372/59 |
| 5,140,600 A | 8/1992 | Rebhan | 372/25 |
| 5,142,543 A | 8/1992 | Wakabayashi et al. | 372/32 |
| 5,150,370 A | 9/1992 | Furuya et al. | 372/106 |
| 5,221,823 A | 6/1993 | Usui | 219/121.78 |
| 5,226,050 A | 7/1993 | Burghardt | 372/20 |
| 5,243,614 A | 9/1993 | Wakata et al. | 372/29 |
| 5,247,531 A | 9/1993 | Müller-Horsche | 372/38 |
| 5,247,534 A | 9/1993 | Müller-Horsche | 372/58 |
| 5,247,535 A | 9/1993 | Müller-Horsche et al. | 372/86 |
| 5,307,364 A | 4/1994 | Turner | 372/60 |
| 5,311,565 A * | 5/1994 | Horikawa | 378/43 |
| 5,331,456 A * | 7/1994 | Horikawa | 359/350 |
| 5,337,330 A | 8/1994 | Larson | 372/86 |
| 5,396,514 A | 3/1995 | Voss | 372/57 |
| 5,404,366 A | 4/1995 | Wakabayashi et al. | 372/29 |
| 5,405,207 A | 4/1995 | Zubli | 401/110 |
| 5,430,752 A | 7/1995 | Basting et al. | 372/59 |
| 5,434,901 A * | 7/1995 | Nagai et al. | 378/43 |
| 5,440,578 A | 8/1995 | Sandstrom | 372/59 |
| 5,450,463 A * | 9/1995 | Iketaki | 378/43 |
| 5,463,650 A | 10/1995 | Ito et al. | 372/57 |
| 5,504,795 A | 4/1996 | McGeoch | 378/119 |
| 5,533,083 A * | 7/1996 | Nagai et al. | 378/44 |
| 5,534,034 A | 7/1996 | Caspers | 623/32 |
| 5,535,233 A | 7/1996 | Mizoguchi et al. | 372/87 |
| 5,557,629 A | 9/1996 | Mizoguchi et al. | 372/87 |
| 5,559,584 A | 9/1996 | Miyaji et al. | 355/73 |
| 5,559,816 A | 9/1996 | Basting et al. | 372/27 |
| 5,596,596 A | 1/1997 | Wakabayashi et al. | 372/102 |
| 5,598,300 A | 1/1997 | Magnusson et al. | 359/566 |
| 5,606,586 A * | 2/1997 | Amemiya et al. | 378/34 |
| 5,652,681 A | 7/1997 | Chen et al. | 359/831 |
| 5,659,419 A | 8/1997 | Lokai et al. | 359/330 |
| 5,659,531 A | 8/1997 | Ono et al. | 369/109 |
| 5,663,973 A | 9/1997 | Stamm et al. | 372/20 |
| 5,684,822 A | 11/1997 | Partlo | 372/95 |
| 5,710,787 A | 1/1998 | Amada et al. | 372/25 |
| 5,729,562 A | 3/1998 | Birx et al. | 372/38 |
| 5,729,565 A | 3/1998 | Meller et al. | 372/87 |
| 5,748,346 A | 5/1998 | David et al. | 359/15 |
| 5,761,236 A | 6/1998 | Kleinschmidt et al. | 372/100 |
| 5,763,855 A | 6/1998 | Shioji | 129/121.84 |
| 5,763,930 A | 6/1998 | Partlo | 250/504 R |
| 5,771,258 A | 6/1998 | Morton et al. | 372/57 |
| 5,802,094 A | 9/1998 | Wakabayashi et al. | 372/38 |
| 5,808,312 A * | 9/1998 | Fukuda | 250/492.2 |
| 5,811,753 A | 9/1998 | Weick et al. | 219/121.78 |
| 5,818,865 A | 10/1998 | Watson et al. | 372/86 |
| 5,835,520 A | 11/1998 | Das et al. | 372/57 |
| 5,835,560 A * | 11/1998 | Amemiya et al. | 378/34 |
| 5,848,119 A * | 12/1998 | Miyake et al. | 378/34 |
| 5,852,627 A | 12/1998 | Ershov | 372/108 |
| 5,856,991 A | 1/1999 | Ershov | 372/57 |
| 5,898,725 A | 4/1999 | Fomenkov et al. | 372/102 |
| 5,901,163 A | 5/1999 | Ershov | 372/20 |
| 5,914,974 A | 6/1999 | Partlo et al. | 372/38 |
| 5,917,849 A | 6/1999 | Ershov | 372/102 |
| 5,923,693 A | 7/1999 | Ohmi et al. | 372/57 |
| 5,936,988 A | 8/1999 | Partlo et al. | 372/38 |
| 5,940,421 A | 8/1999 | Partlo et al. | 372/38 |
| 5,946,337 A | 8/1999 | Govorkov et al. | 372/92 |
| 5,949,806 A | 9/1999 | Ness et al. | 372/38 |
| 5,963,616 A | 10/1999 | Silfvast et al. | 378/122 |
| 5,970,082 A | 10/1999 | Ershov | 372/102 |
| 5,978,391 A | 11/1999 | Das et al. | 372/20 |
| 5,978,394 A | 11/1999 | Newman et al. | 372/32 |
| 5,978,405 A | 11/1999 | Juhasz et al. | 372/57 |
| 5,978,409 A | 11/1999 | Das et al. | 372/100 |
| 5,982,795 A | 11/1999 | Rothweil et al. | 372/38 |
| 5,982,800 A | 11/1999 | Ishihara et al. | 372/57 |
| 5,991,324 A | 11/1999 | Knowles et al. | 372/57 |
| 5,999,318 A | 12/1999 | Morton et al. | 359/572 |
| 6,005,880 A | 12/1999 | Basting et al. | 372/38 |
| 6,020,723 A | 2/2000 | Desor et al. | 320/166 |
| 6,028,872 A | 2/2000 | Partlo et al. | 372/38 |
| 6,028,880 A | 2/2000 | Carlesi et al. | 372/58 |
| 6,031,241 A | 2/2000 | Silfvast et al. | 250/504 R |
| 6,051,841 A | 4/2000 | Partlo | 250/504 R |
| 6,061,382 A | 5/2000 | Govorkov et al. | 372/101 |
| 6,075,838 A | 6/2000 | McGeoch | 378/119 |
| 6,081,542 A | 6/2000 | Scaggs | 372/70 |
| 6,084,897 A | 7/2000 | Wakabayashi et al. | 372/38 |
| 6,130,431 A * | 10/2000 | Berger | 250/372 |
| 6,142,641 A * | 11/2000 | Cohen et al. | 359/859 |
| 6,151,346 A | 11/2000 | Partlo et al. | 372/38 |
| 6,154,470 A | 11/2000 | Basting et al. | 372/19 |
| 6,157,662 A | 12/2000 | Scaggs et al. | 372/60 |
| 6,160,831 A | 12/2000 | Kleinschmidt et al. | 372/57 |
| 6,160,832 A | 12/2000 | Kleinschmidt et al. | 372/57 |
| 6,188,710 B1 | 2/2001 | Besaucele et al. | 372/60 |
| 6,219,368 B1 | 4/2001 | Govorkov | 372/59 |
| 6,256,371 B1 * | 7/2001 | Hasegawa et al. | 378/34 |
| 6,285,743 B1 * | 9/2001 | Kondo et al. | 378/119 |
| 6,327,290 B1 | 12/2001 | Govorkov et al. | 372/61 |
| 6,339,634 B1 * | 1/2002 | Kandaka et al. | 378/119 |
| 6,345,065 B1 | 2/2002 | Kleinschmidt et al. | 372/57 |
| 6,396,900 B1 * | 5/2002 | Barbee et al. | 378/84 |
| 6,399,916 B1 | 6/2002 | Gortler et al. | 219/121.84 |
| 6,414,438 B1 | 7/2002 | Borisov et al. | 315/111.31 |
| 6,442,182 B1 | 8/2002 | Govorkov et al. | 372/29.021 |
| 6,504,900 B1 * | 1/2003 | Kondo et al. | 378/70 |
| 6,504,903 B1 * | 1/2003 | Kondo et al. | 378/119 |
| 6,522,716 B1 * | 2/2003 | Murakami et al. | 378/34 |
| 6,522,717 B1 * | 2/2003 | Murakami et al. | 378/43 |
| 6,526,118 B1 * | 2/2003 | Komatsuda et al. | 378/34 |
| 6,529,533 B1 | 3/2003 | Voss | 372/29.01 |
| 6,590,959 B1 * | 7/2003 | Kandaka et al. | 378/119 |
| 6,594,334 B1 * | 7/2003 | Ota | 378/34 |
| 6,690,764 B1 * | 2/2004 | Kondo | 378/119 |
| 6,781,135 B1 * | 8/2004 | Berger | 250/372 |

OTHER PUBLICATIONS

M.M. Blouke et al., "Large format, high resolution image sensors," *Optical Engineering*, vol. 26, No. 9, Sep. 1987, pp. 837–843.

P-S. Shaw et al., "Ultraviolet radiometry with synchrotron radiation and cryogenic radiometry," *Applied Optics*, vol. 38, No. 1, Jan. 1, 1999, pp. 18–28.

M. Krumrey et al., "Self–calibration of the same silicon photodiode in the visible and soft x–ray ranges," *Rev. Sci. Instrum.*, vol. 66, No. 9, Sep. 1995, pp. 4736–4737.

In re PCT Patent Application No. PCT/EP02/09073, "Notification of Transmittal of the International Search Report or the Declaration," mailed Jan. 23, 2003, 7 pages in length.

R.S. Taylor, "Preionization and Discharge Stability Study of Long Optical Pulse Duration UV–Preionized XeCl Lasers," *Appl. Phys.*, vol. B41, 1–24, No. 1, Sep. 1986, pp. 1–24.

T.Y. Chang, "Improved Uniform–Field Electrode Profiles for TEA Laser and High–Voltage Applications," *The Review of Scientific Instruments*, vol. 44, No. 4, Apr. 1973, pp. 405–407.

E.A. Stappaerts, "A novel analytical design method for discharge laser electrode profiles," *Applied Physics Letters*, vol. 40, No. 12, Jun. 15, 1982, pp. 1018–1019.

G.J. Ernst, "Compact Uniform Field Electrode Profiles," *Optics Communications*, vol. 47, No. 1, Aug. 1, 1983, pp. 47–51.

G.J. Ernst, "Uniform–Field Electrodes with Minimum Width," *Optics Communications*, vol. 49, No. 4, Mar. 15, 1984, pp. 275–277.

Marchetti et al., "A new type of corona–discharge photoionization source for gas lasers," *J. Appl. Phys.*, vol. 56, No. 11, Dec. 1, 1984, pp. 3163–3168.

Ogura et al., "Output Power Stabilization of a XeCl Excimer Laser by HCl Gas Injection," *Proceedings of SPIE: Gas and Metal Vapor Lasers and Applications*, Jan. 22–23, 1991, vol. 1412, pp. 123–128.

Golobic et al., "Clinical Experience with an Excimer Laser Angioplasty System," *SPIE: Diagnostic and Therapeutic CardiovascularInterventions*, vol. 1425, Jan. 20–22, 1991, pp. 84–91.

Ujda et al., "Analysis of Possibility of Computer Control of the Parameters of an Excimer Laser," *Journal of Technical Physics (J. Tech. Phys. 32, 3–4, 399–408)*: Results of computerization of the parameters of a XeCl laser, 1991, pp. 399–408.

Dr. D. Basting, *Industrial Excimer Lasers: Fundamentals, Technology and Maintenance*, Lambda Physik AG, 1991, pp. 1–97.

Turner et al. "Dependence of Excimer Laser Beam Properties on Laser Gas Composition," 1992, *SPIE*, vol. 1835, pp. 158–164.

Elliott et al., "Recent advances in an excimer laser source for microlithography," Nov./Dec. 1991, *J. Vac. Sci. Technol B9*(6), pp. 3122–3125.

Taylor et al., "Pre–preioniation of a long optical pulse magnetic–spiker sustainer XeCl laser," *Rev. Sci. Instrum.*, vol. 65, No. 12, Dec. 1994, pp. 3621–3627.

Dirk Basting, Lambda Physik AG, Jan. 23, 1996, "Laserröhre für halogenhaltige Gasentladungslaser," 7 pages in length.

Borisov et al., "Effects limiting the average power of compact pulse–periodic KrF lasers," *Quantum Electronics*, 1995, vol. 25, No. 5, pp. 421–245.

Taylor et al., "Transmission Properties of Spark Preionization Radiation in Rare–Gas Halide Laser Gas Mixes," *IEEE Journal of Quantum Electronics*, No. 12, Dec. 1995, pp. 2195–2207.

Wakabayashi et al., "Billion level durable ArF excimer laser with highly stable energy," *Laser Research Dept. Research Division*, Japan, 11 pages in length.

Enami et al., "High spectral purity and high durability kHz KrF excimer laser with advanced RF pre–ionization discharge," *SPIE*, vol. 3334, 1998, pp. 1031–1040.

Solt et al., "PtSi–η–Si Schottky–barrier photodetectors with stable spectral responsivity in the 120–250 nm spectral range," *Appl. Phys. Lett.*, Dec. 1996, vol. 69, No. 24, pp. 3662–3664.

Shaw et al., "Ultraviolet radiometry with synchrotron radiation and cryogenic radiometry," *Applied Optics*, vol. 38, No. 1, Jan. 1999, pp. 18–28.

Shaw et al., "New ultraviolet radiometry beamline at the Synchrotron Ultraviolet Radiation Facility at NIST," *Metrologia*, vol. 35, 1998, pp. 301–306.

Kuschnerus et al., "Characterization of photodiodes as transfer detector standards in the 120 nm to 600 nm spectral range," *Metrologia*, vol. 35, 1998, pp. 355–362.

Korde et al., "One Gigarad Passivating Nitrided Oxides for 100% Internal Quantum Efficiency Silicon Photodiodes," *IEEE Transactions on Nuclear Science*, vol. 40, No. 6, Dec. 1993, pp. 1655–1659.

Canfield et al., "Absolute silicon photodiodes for 160 nm to 254 nm photons," *Metrologia*, vol. 35, 1998, pp. 329–334.

"International Radiation Detectors Inc.," Internet printout of website: www.ird–inc.com on Dec. 26, 2001, 59 pages in length.

\* cited by examiner

STABLE ENERGY DETECTOR FOR EXTREME ULTRAVIOLET RADIATION DETECTION

PRIORITY

This application claims the benefit of priority to U.S. provisional patent application No. 60/312,277, filed Aug. 13, 2001.

BACKGROUND OF THE INVENTION

1. Field of the Invention

The invention relates to an energy monitoring device, and particularly for monitoring the energy of an extreme ultraviolet radiation source emitting around 11–15 nm.

2. Discussion of the Related Art

Semiconductor manufacturers are currently using deep ultraviolet (DUV) lithography tools based on KrF-excimer laser systems operating around 248 nm, as well as the following generation of ArF-excimer laser systems operating around 193 nm. Molecular fluorine ($F_2$) lasers operating around 157 nm are being developed for use in Vacuum UV (VUV) lithographic processing systems. Extreme UV (EUV) or soft x-ray radiation sources for EUV lithography emitting 11 nm–15 nm photon beams are currently also being developed.

EUV radiation sources have an advantageous output emission beam including 11–15 nm wavelength photons having photon energies in a range around 90 eV. This short wavelength is advantageous for photolithography applications because the critical dimension (CD), which represents the smallest resolvable feature size producible using photolithography, is proportional to the wavelength. This permits smaller and faster microprocessors and larger capacity DRAMs in a smaller package.

A promising technique for producing EUV lithography beams uses a pair of plasma pinch electrodes for driving a preionized azimuthally symmetrical plasma shell to collapse to a central axis. A power supply circuit supplies a high energy, short duration pulse to the electrodes, wherein several kilovolts and up to at a hundred kA or more are applied over a pulse duration of less than a microsecond. A Z-pinch electrode arrangement generates a current through the plasma shell in an axial direction producing an azimuthal magnetic field that provides the radial force on the charged particles of the plasma responsible for the rapid collapse.

The excimer and molecular fluorine lithography lasers, mentioned above, emit laser beams using a gas discharge for creating a population inversion to a metastable state in the laser active gas, and a resonator for facilitating stimulated emission. It is not yet completely clear what radiative mechanism is responsible for the axial, high energy photon emission in plasma pinch EUV sources. The collapsing shell of charged particles of the plasma have a high kinetic energy due to their velocities in the radial direction. The rapid collapse of the shell results in collisions between all portions of the incoming shell at the central axis with radially opposed portions of the incoming shell.

The high kinetic energies of the particles are abruptly transformed into a hot, dense plasma which emits x-rays. A high recombination rate concentrated in the azimuthal direction due to the plasma being particularly optically dense in the azimuthal direction has been proposed (see, Malcolm McGeoch, Radio Frequency Preionized Xenon Z-Pinch Source for Extreme Ultraviolet Lithography, Applied Optics, Vol. 37, No. 9 (Mar. 20, 1998), which is hereby incorporated by reference), and population inversion resulting in spontaneous emission and predominantly azimuthal stimulated emission, and bremsstrahlung resulting from the rapid radially deceleration of the charged particles of the collapsing plasma, are other mechanisms of high energy photon emission.

In the past, i.e., prior to the investigations leading up to the present application, very little was known about the behavior of EUV-photodetectors under long-term 157 nm laser pulse radiation exposure. In addition, until now, no reliable energy monitor for detecting the pulse energy of an extreme ultraviolet beam having a wavelength around 11–15 nm has been available. For detecting 193 nm and 248 nm excimer laser radiation, UV-photodetectors such as the International Radiation Detectors, Inc. (IRD) UVG 100 (Si photodiode with oxinitride cover) or the Hamamatsu S 5226 or S1226 have been used typically as energy monitor detectors. However, these detectors may strongly degrade under exposure to EUV photon radiation.

It is therefore desired to have a reliable photodetector for monitoring pulse energies and/or another parameter of an extreme ultraviolet radiation source.

SUMMARY OF THE INVENTION

In view of the above, Si based photodiodes with special structure for long lifetime under EUV irradiation are provided for use as a detector for EUV radiation, preferably in combination with other optical components. These detectors preferably can be Si pn diodes with doped dead region and zero surface recombination (Si dead region diode). Another preferred detector is the Si pn diode with PtSi barrier (PtSi photodiode). The PtSi photodiode can also be of Schottky type. Both the Si dead region diode and the PtSi photodiode detector exhibits advantageous long-term stability under EUV exposure compared to detectors including conventional photodiodes.

Si dead region diodes and PtSi photodiodes may be used as photon detectors for exposure wavelengths from 0.5 nm to 10,000 nm. For example, they have been described for use as detectors for molecular fluorine laser radiation around a wavelength of 157 nm (see U.S. patent application Ser. No. 09/771,013, which is assigned to the same assignee as the present application and is hereby incorporated by reference). Long-term tests using this wavelength show much better stability compared to other investigated detectors (e.g. Si n-p, Si p-n or GaAsP Schottky photodiodes). In accordance with the present invention, a Si dead region diode or a PtSi photodiode is provided for use as a detector for EUV radiation with wavelengths around 11–15 nm, such as around 13.4 nm, 13.0 nm or 11.5 nm, for EUV lithography and other applications.

In combination with multilayer mirrors and free-standing filters, the spectral range of the detected radiation is advantageously reduced, according to a preferred embodiment, to a small region of interest in the EUV wavelength region. The filter may alternatively be directly deposited on the surface of the diode itself. This increases the stability of the filter and makes the handling of the detector unit less complex.

BRIEF DESCRIPTION OF THE DRAWINGS

(FIG. 11c, 11310)

(FIG. 1 11310)

(FIG. 2, 11310)

(FIG. 3, 11310)

INCORPORATION BY REFERENCE

Figure 1:
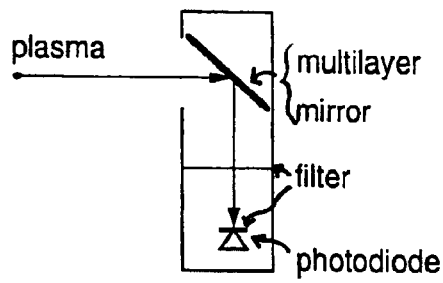
FIG. 1 schematically illustrates a first embodiment of an energy monitor for use with an EUV radiation source.

What follows is a cite list of references each of which is, in addition to those references cited above and below herein, including that which is described as background, and the above invention summary, are hereby incorporated by reference into the detailed description of the preferred embodiment below, as disclosing alternative embodiments of elements or features of the preferred embodiments not otherwise set forth in detail below. A single one or a combination of two or more of these references may be consulted to obtain a variation of the preferred embodiments described in the detailed description below. Further patent, patent application and non-patent references are cited in the written description and are also incorporated by reference into the detailed description of the preferred embodiment with the same effect as just described with respect to the following references:

K. Solt, et al., PtSi-n-Si Schottky-barrier photodetctors with stable spectral responsivity in the 120–250 nm spectral range, Appl. Phys. Lett 69, 3662 (1996);

P. S. Shaw, et al. Ultraviolet radiometry with synchrotron radiation and cryogenic radiometry, Appl. Optics 38, 18 (1999);

P. S. Shaw, et al., New ultraviolet radiometry beamline at the Synchrotron Ultraviolet Facility at NIST, Metrologia 35, 301 (1998);

P. Kuschnerus, et al., Characterization of photodiodes as transfer detector standards in the 120 nm to 600 nm spectral range, Metrologla 35, 355 (1998);

IRD datasheet, SXUV Series Photodiodes, September 1999 (www.ird-inc.com);

R. Korde, et al., One Gigarad passivating Nitride Oxide for 100% Internal Quantum Efficiency Silicon Photodiodes, IEEE Transactions on Nuclear Science 40, 1655 (1993);

L. R. Canfield, et al., Absolute Silicon photodiodes for 160 nm to 254 nm Photons Metrologia 35, 329 (1998);

R. Korde, et al., Stable silicon photodiodes with platinium Silicide front window for the ultraviolet, presented at the VUV-XII conference;

Malcolm McGeoch, Radio Frequency Preionized Xzenon Z-Pinch Source for Extreme Ultraviolet Lithography, Applied Optics, Vol. 37, No. 9 (Mar. 20, 1998);

Proceedings of the SPIE3997, 162 (2000);

Proceedings SEMATECH-workshop Octobner 2000, San Francisco;

U.S. Pat. Nos. 6,219,368 6,051,841, 5,763,930, 6,031,241, 5,963,616, 5,504,795, 6,075,838, 6,154,470;

German patent document no. 197 53 696; and

U.S. patent application Ser. Nos. 60/281,446, 09/512,417, 09/598,552, 09/712,877, 09/594,892, 09/131,580, 09/317,695, 09/738,849, 09/718,809, 09/771,013, 09/693,490 and 09/588,561, each U.S. application of which is assigned to the same assignee as the present application.

DETAILED DESCRIPTION OF THE PREFERRED EMBODIMENT

The preferred embodiment includes a device for the extreme ultraviolet (EUV) radiation detection. The detected radiation is preferably limited to a spectral range which can pass an optical system containing several multilayer mirrors as under discussion for an extreme ultraviolet lithography (EUVL) device.

The presented device can be used to measure the in-band power of a pulsed or continuous wave extreme ultraviolet (EUV) source. In-band describes a wavelength region of about 2% bandwidth like it is reflected by several multilayer mirrors at a wavelength between 11 and 15 nm.

FIG. 1 schematically shows an embodiment of the device. FIG. 1 is a schematic of the proposed setup including a single multilayer mirror. The radiation from the EUV source is reflected by a multilayer mirror to the detector. The design of the multilayer mirror is adapted to the wavelength of interest and the incidence angle of the radiation.

The detector itself may be sensitive for infrared light, visible light, ultraviolet and EUV radiation as well as for harder x-rays. The infrared, visible and ultraviolet light is preferably filtered by one or more opaque filters, e.g. beryllium, niobium, zirconium, yttrium, and/or silicon, among others. These filters can be either free standing foils or directly deposited layers on the surface of the photodiode. The filter or filters reduce the out-band light at the long wavelength side by several orders of magnitude. The x-ray flux to the detector is reduced several orders of magnitude by the multilayer mirror itself. Using a combination of filter and multilayer mirror, the spectral region of radiation reaching the detector without attenuation is in the EUV wavelength range and depends on the reflection characteristic of the multilayer mirror. The intensity of the radiation on the detector can be varied by varying the filter thickness as well as by geometrical absorbers (e.g. mesh filter or apertures).

The setup also allows to use a CCD camera as detector combined with a free standing transmission filter. For example, backside illuminated CCD cameras may be used as sensitive detectors for EUV radiation.

Figure 2:
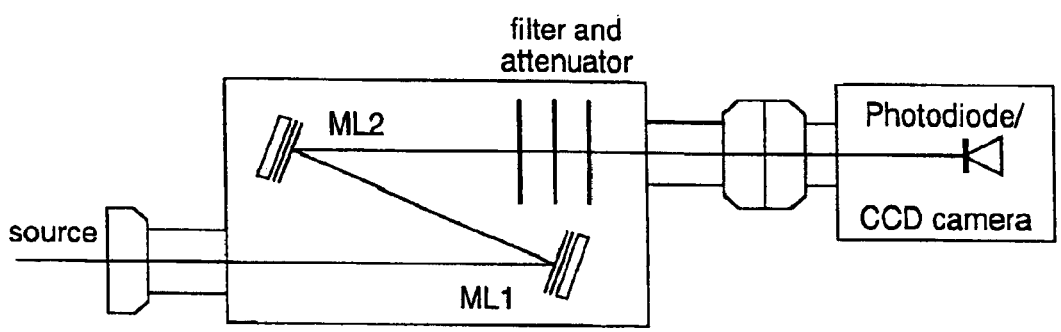
FIG. 2 schematically illustrates a second embodiment of an energy monitor for use with an EUV radiation source.

FIG. 2 shows a similar setup using a set of two multilayer mirrors. FIG. 2 shows a schematic of the proposed setup using a set of two multilayer mirrors and a modular setup which allows the exchange of the detector unit. A filter and an attenuator can be installed optionally in the beamline.

Figure 3:
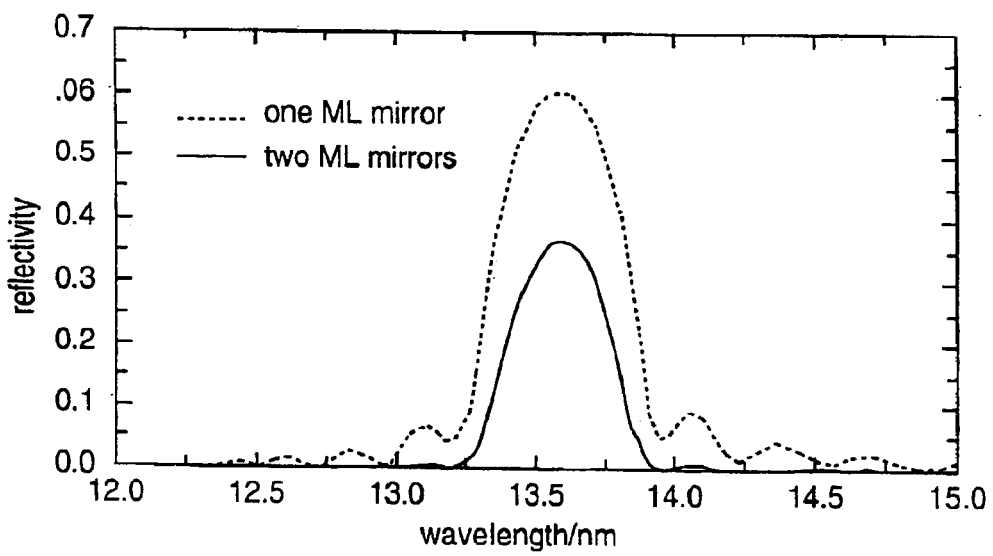
FIG. 3 is a graph including plots of reflectivity versus wavelength for multilayer mirrors of an energy detector system according to a preferred embodiment.

Arrangements including more than two mirrors may be employed, as well. The reflection characteristic of two multilayer mirrors is shown in FIG. 3 in comparison to a single mirror reflection characteristic. FIG. 3 shows a calculated reflection characteristic of a single multilayer mirror and a set of two multilayer mirrors in comparison. The out-band radiation reflection can be reduced drastically compared to the reflection on a single mirror. Additionally the width of the reflection curve is more narrow, which is better adapted to the reflection characteristic of a whole optical system planned to use in an EUVL device. Both effects lead to a more accurate EUV signal of the wavelength region of interest considering the application EUVL.

Figure 4:
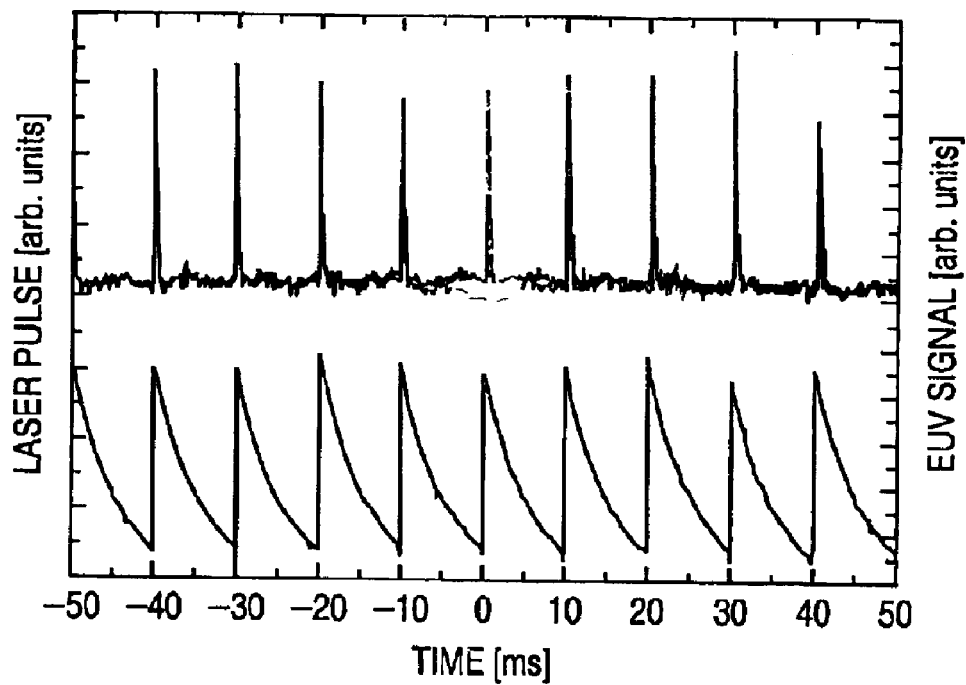
FIG. 4 is a graph showing plots of laser pulses and EUV signals versus time for an energy detector according to a preferred embodiment.

The working principle is shown in FIG. 4. FIG. 4 illustrates a verification of the working principle of the device demonstrated with a laser produced plasma. The upper curve shows the signal generated by a photodiode illuminated by the laser radiation, the lower signal was generated by the setup shown in FIG. 1. The two signal lengths are different due to different rise times of the used photodiodes.

In the experimental setup the EUV source was a laser produced plasma. The two signals show the laser pulses detected by a photodiode (top signal) and the EUV signal detected with a device shown in FIG. 1.

Another advantageous feature of the proposed device is the use of a focussing multilayer mirror with a curved surface. This can increase the photon flux on the detector and the sensitivity of the monitor setup.

Also provided according to a preferred embodiment herein, a beam parameter monitoring unit for coupling with an EUV source that produces an output beam having a wavelength around 11–15 nm is provided. The monitoring unit schematically illustrated at FIGS. 5–8 includes a beam splitter, a detector and a beam path enclosure. The beam splitter is disposed to separate the output beam into a first component and a second component, wherein the first component is used for processing a workpiece. The detector according to this embodiment includes a platinum silicide window or it otherwise comprises a Si dead region diode, PtSi, and particularly PtSi-nSi, for measuring at least one optical parameter of the second component of the output beam after the beam splitter. The presence of the platinum silicide reduces EUV radiation exposure induced instability of the detector. The beam path enclosure contains the beam splitter and has an interior prepared such that an optical path of the second component of the output beam through the enclosure from the laser resonator to the detector via the beam splitter is substantially free of EUV photoabsorbing species so that the second component reaches the detector without substantial attenuation from the photoabsorbing species.

Figure 5:
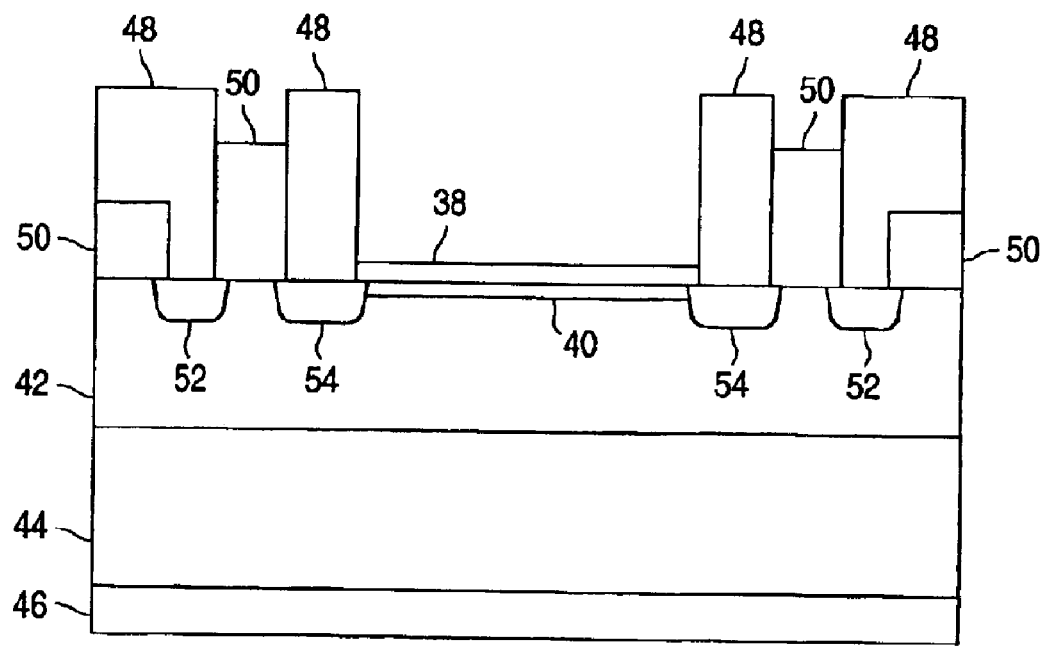
FIG. 5 schematically illustrates an energy detector according to a preferred embodiment.

FIG. 5 shows an embodiment of a detector 3 for use in a detector housing 2 coupled with a beam path enclosure 1 as described below with respect to FIGS. 6–8. The particular detector 3 shown in FIG. 5 is manufactured by International Radiation Detectors, Inc. and further information may be found at www.ird-inc.com, which information contained at that web site is hereby incorporated by reference. It is recognized herein that the detector shown at FIG. 5 has been particularly configured for use with VUV exposure radiation and that the detector shown at FIG. 5 may be modified according to its use with EUV exposure wavelengths.

The detector 3 shown includes a platinum silicide (PtSi) window 38 for reducing EUV radiation exposure induced instability of the detector 3. More than one PtSi layer may be included in the detector design. The platinum silicide layer may be located in another location, such as beneath one or more other material layers of the device. The detector 3 also may include a defect free n-type region 40 beneath the PtSi window 38 and above an epitaxial p-type region which itself lies above a p+ substrate 44 over a chromium gold base layer 46. The detector 3 shown also may have four aluminum contacts 48 and four insulating field oxide regions 50. A pair of p+ regions and a pair of n+ regions are also shown implanted into the epitaxial layer 42.

It is recognized herein that the presence of the PtSi reduces EUV radiation exposure induced instability of the detector 3. The PtSi may be used in combination with other materials to form a hybrid layer. The PtSi may have substitutional or inter-dispersed species doped therein, or PtSi itself may be doped into another material-type layer. Several PtSi layers may be included, wherein the PtSi layers may have other material layers therebetween. It is recognized herein that PtSi may be used in a detector that is protected within an enclosure for delivering EUV radiation, particularly around 11–15 nm, as is preferably emitted by an extreme ultraviolet radiation source, and that although an embodiment is shown at FIG. 5 as a detailed schematic of a detector 3 of FIGS. 6–8, below, the detector 3 of FIGS. 6–8 preferably includes PtSi in any of a variety of forms and locations within the detector 3 as may be understood by those skilled in the art.

The invention provides a detector for a monitoring an output beam parameter of an extreme ultraviolet radiation source emitting radiation around 11–15 nm. Preferred embodiments preferably exhibit little or no degradation of spectral sensitivity even after high exposure dosage. The preferred embodiments include EUV-photodetectors which are very stable under strong 11–15 nm exposure preferably under inert gas purged or evacuated illumination conditions.

The preferred embodiments include an evacuatable or purgeable vacuum tight energy monitor housing which contains an advantageously stable EUV-photodiode detector. Radiation attenuators, apertures, EUV-light scattering plates, electrical pass through means, purge gas inlet and/or means of flowing purging gas through the exposed detector housing or for evacuating the housing may also be included. FIG. 6 schematically shows a beam splitting enclosure including an energy detector 3 within an energy detector housing 2 and beam splitting optics 4a, 4b within a beam path enclosure preferably connected through a vacuum seal to the detector enclosure 2.

Figure 6:
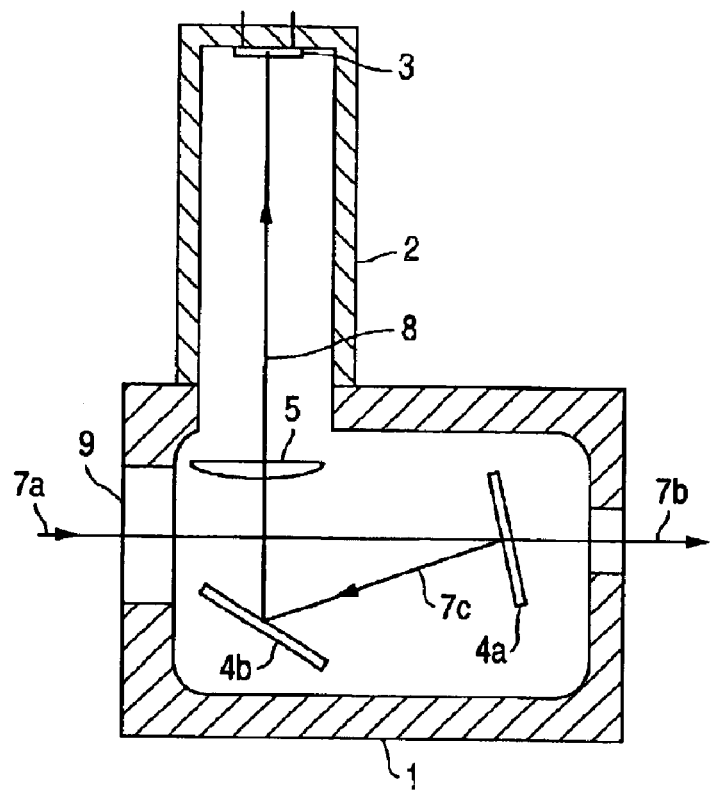
FIG. 6 schematically illustrates a beam splitting enclosure including an energy monitor and beam splitting optics that may be used according to a preferred embodiment.

FIG. 6 shows in detail a beam path enclosure 1 containing the beam splitting optics 4a, 4b. The enclosure 1 may have an interior prepared such that an optical path of a incoming beam 7a and a split off beam portion 7c of the beam 7a through the enclosure 1 from an EUV source (not shown in FIG. 6) to a detector housing 2 containing the detector 3 is substantially free of EUV absorbing species so that the beam portion 7c can reach the detector without substantial attenuation due to the presence of EUV absorbing species.

The incoming beam 7a is preferably coming from an EUV radiation source (not shown in FIG. 6). The enclosure 1 is either connected directly to the output of the EUV source, or at least a beam path from the output to a window 9 of the enclosure is substantially free of EUV absorbing species such as having a flow of inert gas or substantial vacuum continuously present in the path of the beam 7a.

The beam 7b is shown passing through the beam splitter 4a and exiting from the enclosure 1. Another enclosure of a beam path that leads to an application process may be connected directly to the enclosure, or at least the beam path is free of EUV absorbing species, such as described above with respect to the incoming beam. The beam 7a may alternatively be previously split off from a beam that is transmitted to an application process, or the beam that is used at the application process may be the output from the EUV source, or vice-versa with respect to these two beams.

The beam 7a is shown incident at a beam splitter 4a. In this embodiment, the beam splitter 4a is preferably an uncoated EUV transmissive plate such as of a material known to those skilled in the art. The beam 7c is then reflected from an EUV mirror 4b through optics 5 and into the detector enclosure 2 and is incident on the detector 3.

As a whole the energy monitor unit includes a beam separation box containing beam splitting optics 4a, 4b and the EUV detector housing 2 which contains a preferred EUV-photodetector 3, as described in more detail elsewhere herein. Preferably, the EUV detector housing 2 is directly connected to the beam path enclosure 1 by a suitable vacuum fitting, preferably a DN40 flange (not shown in FIG. 6, but see flange 16 at FIG. 7). Both housings 1 and 2 are preferably vacuum tight and are purged by suitable purge gases, or are evacuated, such as a noble gas such as Ar or another inert gas that does not significantly absorb EUV radiation, e.g., around 11–15 nm. This preferred arrangement advantageously prevents absorption of the EUV radiation which is emitted by the EUV source, and enters the beam enclosure 1 from the left in FIG. 6 via a purged or evacuated beam line directly connected to the output of the EUV source (not shown in FIG. 6), or otherwise as discussed herein.

In a preferred embodiment, the beam separation box including the enclosure 1 contains suitable optics to split a certain beam portion 7c (about 1% to 15%) of the main beam 7a, and redirect the beam portion 7c into the detector housing 2, and those optics may be alternatively to those described above, such as are described at the '552 and/or '952 applications, mentioned above. Such means may include an aperture disposed at or near position 8 of FIG. 6. As mentioned above, in a preferred embodiment, the beam splitting optics 4a, 4b within the enclosure 1 of the beam separation box may include a blank uncoated beam splitter 4a disposed in the path of the main beam line 7a and a highly reflective (HR) mirror for EUV radiation 4b as an additional beam steering mirror. This configuration is advantageously inexpensive to manufacture and prevents problems associated with coating damage due to exposure to the high power main beam 7a. The beam splitter 4a may, however, include one or more coatings.

In an alternative embodiment, a beam splitter is not used. Instead, a first beam is output from an EUV source and a second beam is output from the EUV source already separate from each other. The second beam may be output from another location of the EUV source, such that the first beam is output at one end of the EUV source chamber and the second beam is output at the other end of the EUV source chamber. In an alternative example, the output location of the EUV source may be configured to separate the two beam components. Therefore, including a beam splitter 4a, or other optic having a partially reflecting surface for separating a single output beam into two components such that one component is used to process a workpiece and the other incident at an EUV detector 3 is merely preferred and not necessary, as understood from the above. Any additional optics such as mirror 4b are also merely preferred. Preferably, the component measured at the detector 3 has at least one parameter such as energy, wavelength, bandwidth, spatial or temporal beam profile, divergence, spatial or temporal coherence, etc. that it is desired to be measured that has a known relationship to the same parameter in the other component that is used for processing the workpiece.

Figure 7:
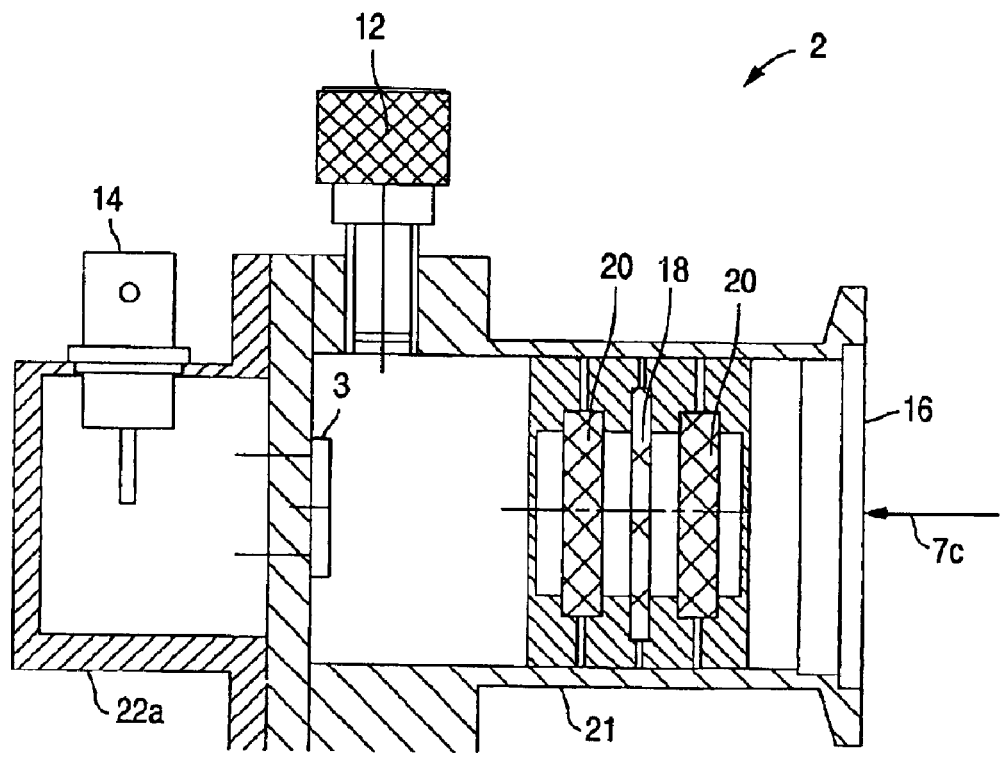
FIG. 7 schematically illustrates a an energy monitor housing which includes a EUV-detector, insertions for several mesh attenuators and scattering plates, a purge gas flow inlet and a signal cable connector plug that may be used according to a preferred embodiment.

FIG. 7 shows a schematic view of the detector housing 2 of FIG. 6 in more detail. The detector housing 2 includes a gas purge inlet 12, and a signal cable connector 14 which is preferably a BNC connector, as shown, and may be another signal cable connector as understood by those skilled in the art, for transmitting electrical signals between the detector 3 and monitoring equipment such as a processor or viewing scope (not shown). The signal cable connector 14 is preferably mounted to the housing 2 by a vacuum tight seal. In addition, the detector housing 2 preferably includes one or more apertures and slits for insertion of an EUV attenuator 18, one or more scattering plates 20 and the EUV-detector itself 3. The detector housing 2 also preferably has a flange 16, such as preferably a DN40 flange, for vacuum tight coupling to the enclosure 1 of FIG. 6. Additionally the detector housing 2 is preferably covered by an electrically conducting shield (not shown), which could be a fine wire mesh or other electrical or magnetic shielding as understood by those skilled in the art, to prevent EMV noise from penetrating into the detector housing 2. Preferably, the detector housing 2 is vacuum tight at all connections and contains multiple purge gas slits including gas inlet 12 to ensure a substantially evacuated condition or an even and continuously flowing purge gas throughput into all areas of the detector housing 2.

The detector housing 2 may be advantageously quickly evacuated and backfilled or purged with an inert gas without accumulation of contaminants or EUV photoabsorptive species of gas which could otherwise produce errors in monitoring a beam parameter by detecting the small amount of EUV radiation 7c which is received at the detector 3 (typically about 1% to 0.001% of the radiation density of the main part of the beam 7a).

As seen in FIG. 7, the detector 3 receives a beam portion 7c which enters a front portion 21 of the detector housing 2 where the flange 16 connects sealably to the enclosure 1 of FIG. 7. The beam traverses the attenuator 18 and scattering plates 20 and preferably one or more apertures (not shown) prior to impinging upon the detector 3. The signal cable connector 14 is located in a back portion 22a of the detector housing 2.

Figure 8:
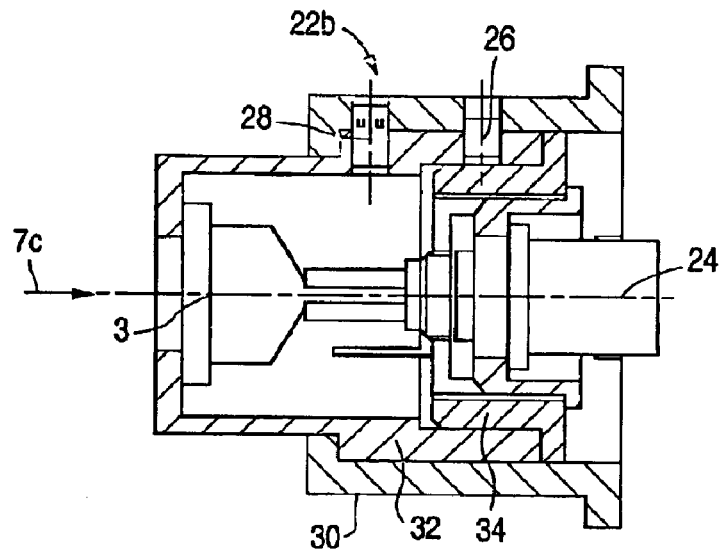
FIG. 8 schematically illustrates a portion of a detector housing including a vacuum tight interconnection between exchangeable detectors and a pass through signal cable connector that may be used according to a preferred embodiment.
Figure 10:
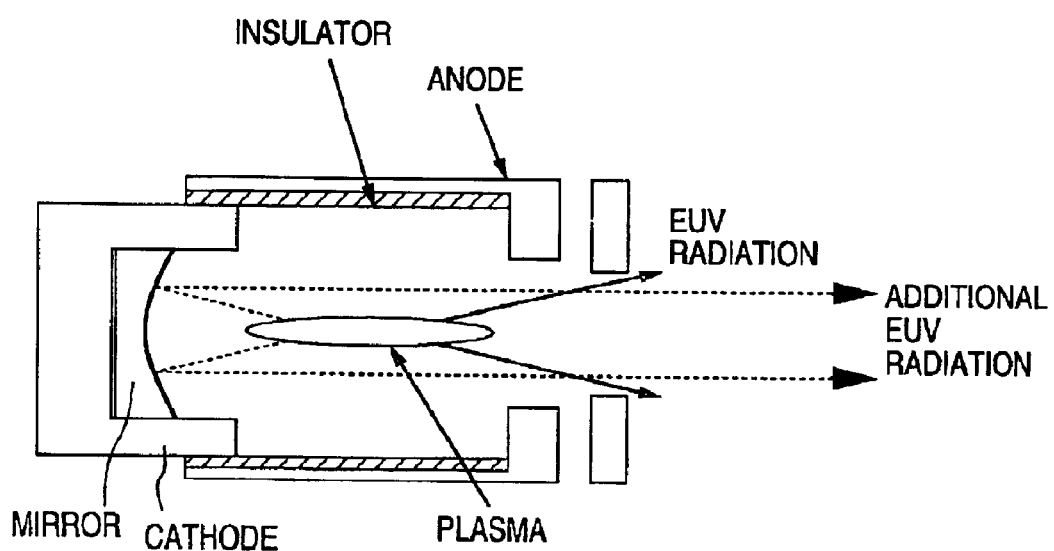
FIG. 10 schematically illustrates an EUV or soft x-ray generating source in accord with a second embodiment.

FIG. 8 schematically shows a detailed view of a modified embodiment of the back portion 22b of a vacuum tight detector, which performs a same function as the detector housing 2 of FIG. 8, and which shows the detector 3 disposed within the back portion 22b. The beam 7c is then incident at the detector 3 through an optical opening between the front portion 21 (not shown, but see FIG. 8) and the back portion 22b. The signal cable connector plug 24 has two O-ring seals 26, 28 between three housing sections 30, 32, 34 to the back portion of detector housing 22b, making it vacuum tight.

Figure 9:
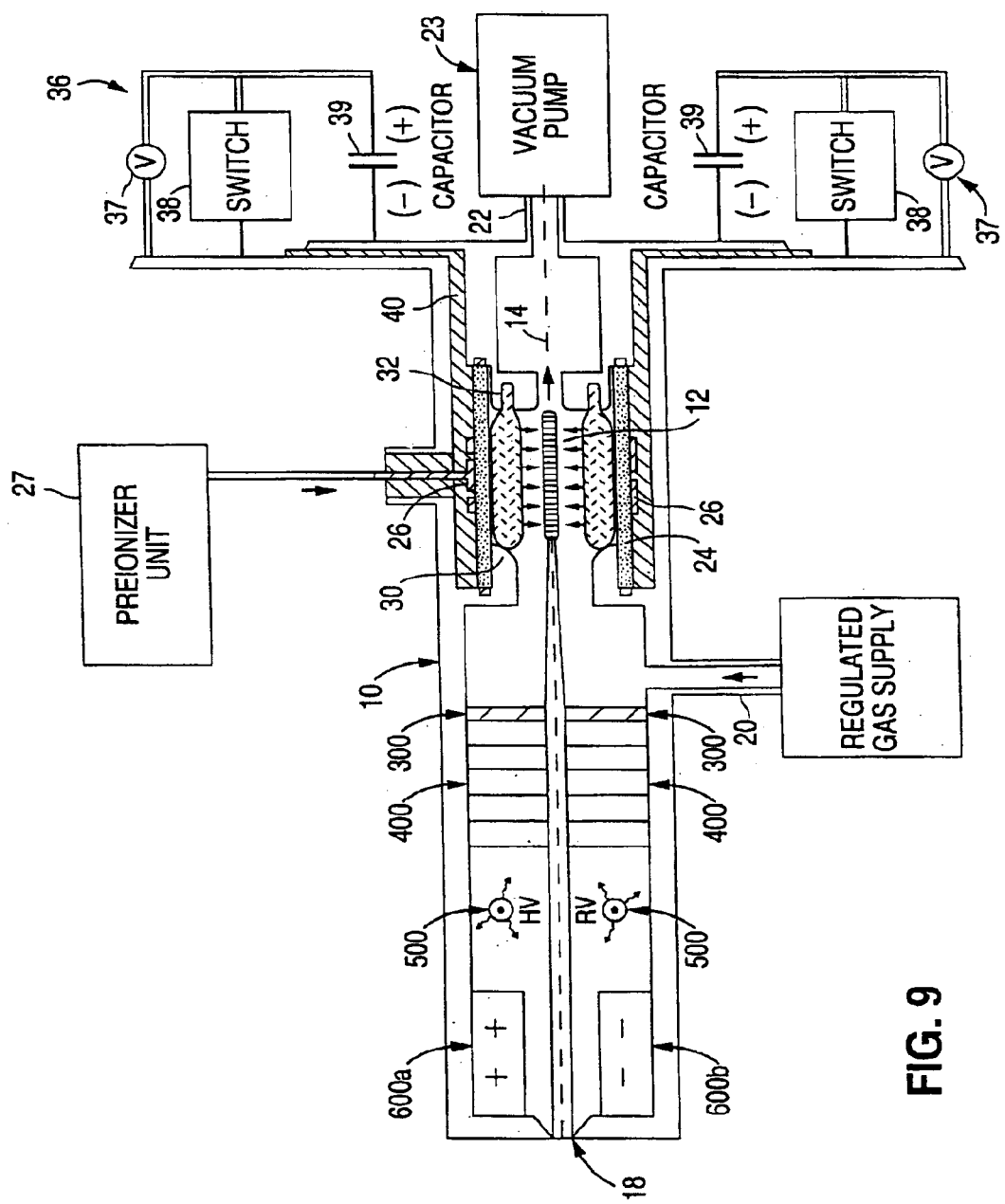
FIG. 9 schematically illustrates an EUV or soft x-ray generating source in accord with a first embodiment.
Figure 11:
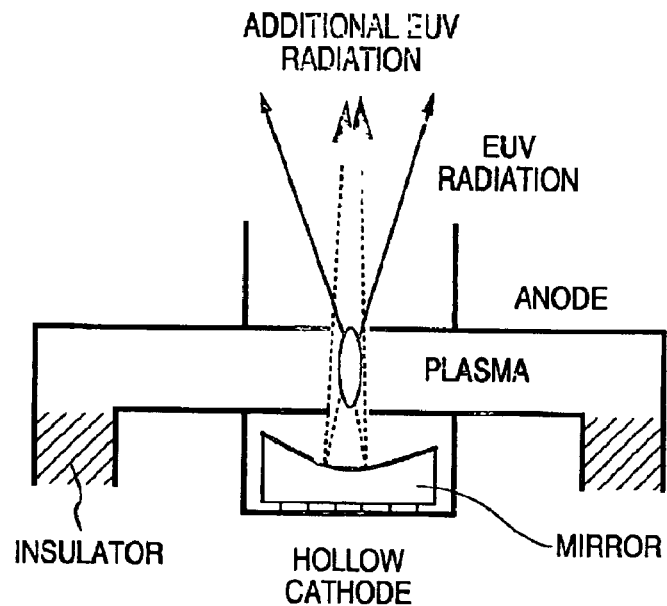
FIG. 11 schematically illustrates an EUV or soft x-ray generating source in accord with a third embodiment.
Figure 12:
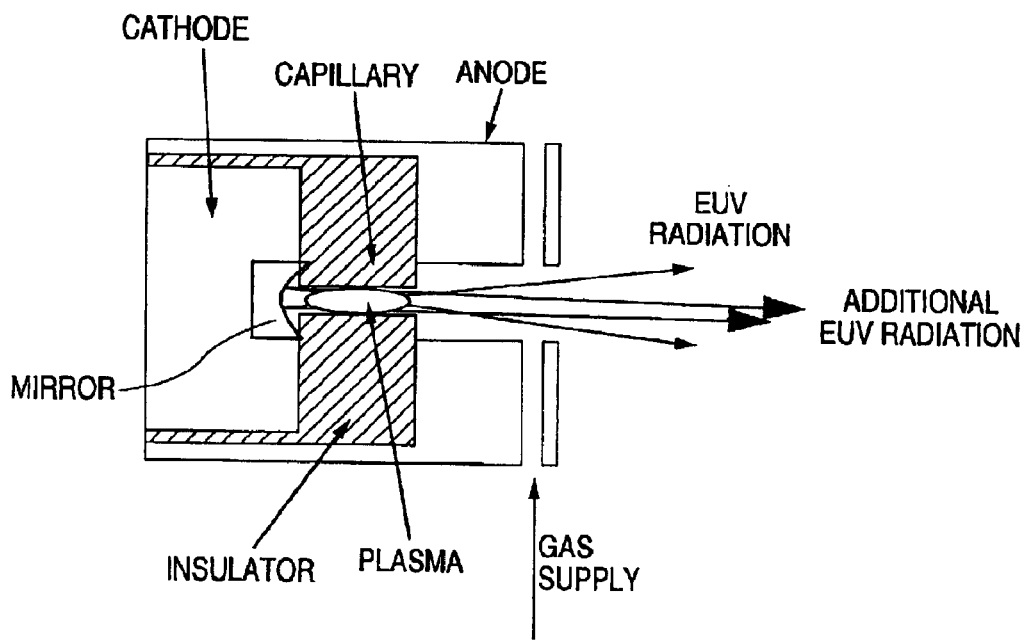
FIG. 12 schematically illustrates an EUV or soft x-ray generating source in accord with a fourth embodiment.
Figure 13:
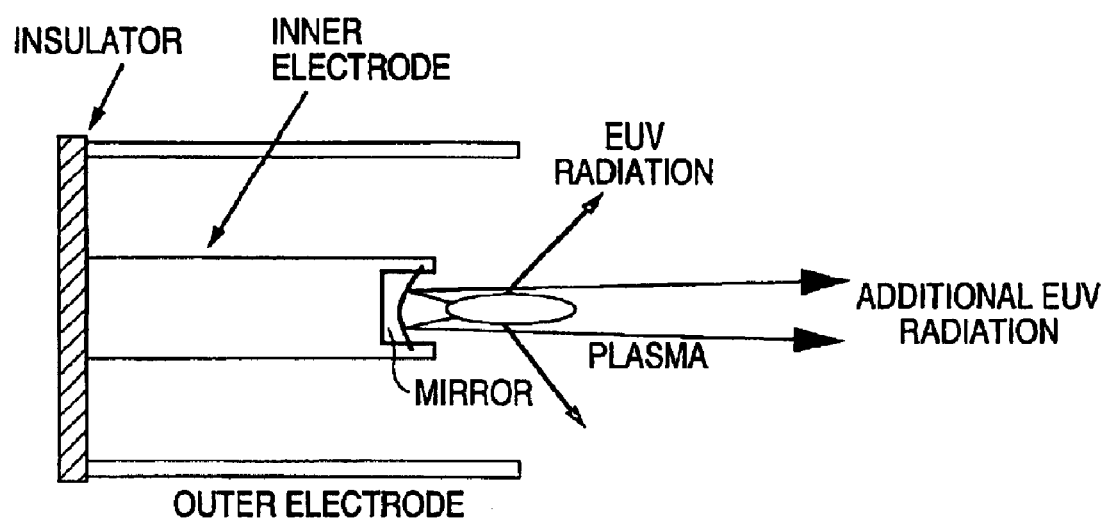
FIG. 13 schematically illustrates an EUV or soft x-ray generating source in accord with a fifth embodiment.

FIG. 9 schematically shows an EUV generating source in cross section in accord with an exemplary embodiment. The features described above and below with reference to FIGS. 1–8 and 10–13 may be implemented in any of a wide variety of EUV sources, and many of those alternative sources may be understood by reviewing the reference incorporated by reference into this application and also as may be understood by those skilled in the art. Many components of the exemplary EUV source shown in FIG. 9 may be understood from the description at U.S. Pat. No. 5,504,795 which is hereby incorporated by reference. The EUV source includes a pinch chamber 10 having a pinch region 12 defining a central axis 14 at the end of which is an EUV photon transmitting window 18. A dielectric liner 24 surrounds preferably the pinch region 12.

A gas supply inlet 20 and an outlet 22 controllably supply active and diluent gases to the pinch region 12. The outlet 22 is connected to a vacuum pump 23. Other gas supply systems are possible such as may be borrowed and/or modified from excimer laser technology (see U.S. Pat. Nos. 4,977,573 and 6,212,214, and U.S. patent application Ser. Nos. 09/447,882 and 09/453,670, each of which is assigned to the same assignee as the present application, and U.S. Pat. Nos. 5,978,406 and 5,377,215, all of which are hereby incorporated by reference). The gas may be circulated and electrostatic and/or cryogenic purification filters may be inserted into the gas loop (see U.S. Pat. Nos. 4,534,034, 5,136,605 and 5,430,752, each of which is hereby incorporated by reference). A heat exchanger may also be provided in the gas loop (see the '670 application, mentioned above and U.S. Pat. No. 5,763,930, which is hereby incorporated by reference).

The gas mixture includes an x-radiating gas such as xenon, krypton, argon, neon, oxygen or lithium. The gas mixture also preferably includes a low atomic number diluent gas such as helium, hydrogen, deuterium, and possibly nitrogen. Preferably xenon (11–15 nm), lithium (13.4 nm) and/or oxygen (13.0 nm), and preferably a buffer gas such as helium, are used.

A preionization electrode 26 is connected to a preionization unit 27 for preionizing the gas in the pinch region 12. Many preionization unit types are possible such as e-beam, conical pinch discharge and RF preionization (see the '795 patent, mentioned above, U.S. patent application Ser. No. 09/693,490, which is assigned to the same assignee as the present application, and C. Stallings, et al., Imploding Argon Plasma Experiments, Appl. Phys. Lett. 35 (7), Oct. 1, 1979, which are hereby incorporated by reference). Some known laser preionization systems may be modified to provide preionization for the EUV source, as well (see U.S. Pat. Nos. 5,247,535, 5,347,532 and U.S. patent application Ser. Nos. 09/247,887, 09/692,265, 09/532,276, 60/228,186, each of which is assigned to the same assignee as the present application and is hereby incorporated by reference. The preionization unit 27 and electrode 26 preionizes the pinch plasma in a symmetrical shell around the central axis 14, as shown, prior to the application of the main pulse to the main electrodes 30 and 32.

The preferred main electrodes 30, 32 are as shown in FIG. 9. The anode 30 and the cathode 32 are shown located at opposite ends of the pinch region 12. Many other anode-cathode configurations are possible (see U.S. Pat. Nos. 3,961,197, 5,763,930, 4,504,964 and 4,635,282, each of which is hereby incorporated by reference). A power supply circuit 36 including a voltage source 37, a switch 38 and capacitor 39 connected to electrodes 30, 32 generates electrical pulses that produce high electric fields in the pinch region which in turn create azimuthal magnetic fields causing the preionized plasma to rapidly collapse to the central axis 14 to produce an EUV beam output along the central axis 14. Many power supply circuits are possible (see U.S. Pat. No. 5,142,166 which is hereby incorporated by reference). The anode 30 and cathode 32 are separated by an insulator 40.

A prepulse may be generated, as well. The prepulse occurs just prior to the main pulse and after the plasma is substantially preionized by the preionization unit 27 and electrode 26. The prepulse is a relatively low energy discharge provided by the main electrodes 30, 32. The prepulse creates more homogeneous conditions in the already preionized plasma preventing electrode burnout at hotspots from arcing due to the high voltage, fast rise time of the main pulse. A prepulse circuit is described at Giordano et al., referred to and incorporated by reference, below, and may be modified to suit the EUV source of the preferred embodiment.

Many other configurations of the above elements of the preferred embodiment are possible. For this reason, the following are hereby incorporated by reference: Weinberg et al., A Small Scale Z-Pinch Device as an Intense Soft X-ray Source, Nuclear Instruments and Methods in Physics Research A242 (1986) 535–538; Hartmann, et al., Homogeneous Cylindrical Plasma Source for Short-Wavelength laser, Appl. Phys. Lett. 58 (23), Jun. 10, 1991; Shiloh et al., Z Pinch of a Gas Jet, Phys. Rev. Lett. 40 (8), Feb. 20, 1978; Choi et al., Temporal Development of Hard and Soft X-ray Emission from a Gas-Puff Z Pinch, 2162 Rev. Sci. Instrum. 57 (8) August 1986; McGeoch, Appl. Optics, see above; Pearlman, et al., X-ray Lithography Using a Pulsed Plasma Source, 1190 J. Vac. Sci. Technol. 19 (4) November/December 1981; Matthews et al., Plasma Sources for X-ray Lithography, 136 SPIE Vol. 333 Submicron Lithography (1982); Mather, Formation of a High Density Deuterium Plasma Focus, Physics of Fluids, 8 (3) February 1965; Giordano et al. Magnetic Pulse Compressor for Prepulse Discharge in Spiker Sustainer Technique for XeCl Lasers, Rev. Sci. Instrum. 65 (8), August 1994; Bailey et al., Evaluation of the Gas Puff Z Pinch as an X-ray Lithography and Microscopy Source; U.S. Pat. Nos. 3,150,483, 3,232,046, 3,279,176, 3,969,628, 4,143,275, 4,203,393, 4,364,342, 4,369,758, 4,507,588, 4,536,884, 4,538,291, 4,561,406, 4,618,971, 4,633,492, 4,752,946, 4,774,914, 4,837,794, 5,023,897, 5,175,755, 5,241,244, 5,442,910, 5,499,282, 5,502,356, 5,577,092, 5,637,962; and the sources previously referred to above.

Between the pinch region 12 and the EUV transmitting window 18 are several advantageous features. A first is a clipping aperture 300 which is spaced a proximate distance from the pinch region 12. The clipping aperture 300 may be formed as shown or may be offset at an angle such as is described at U.S. Pat. No. 5,161,238 which is assigned to the same assignee as the present application and is hereby incorporated by reference. The clipping aperture 300 comprises a material exhibiting a high thermal stability. That is, the clipping aperture preferably has a high thermal conductivity and a low coefficient of thermal expansion. The clipping aperture preferably comprises a ceramic material such as $Al_2O_3$, sapphire or alumina.

The clipping aperture is positioned close to the pinch region, but not too close to the pinch region 12 that thermal effects degrade its performance. The clipping aperture 300 blocks acoustic waves and particulates travelling with the acoustic waves from following the beam on the remainder of its journey through the pinch chamber 10. The aperture is further preferably configured to reflect and/or absorb the acoustic waves so that they do not reflect back into the pinch region 12. The size of the clipping aperture 300 is selected to match the divergence of the beam.

A set of baffles 400 is provided after the clipping aperture. The baffles 400 may be configured similar to those described at U.S. Pat. No. 5,027,366, which is hereby incorporated by reference. The baffles 400 serve to diffuse the effect of acoustic waves emanating from the pinch region such as the flow of gases and contaminant particulates travelling with the acoustic waves, as well as to prevent reflections back into the pinch region. The baffles 400 preferably absorb such disturbances.

An ionizing unit 500 is shown located after the baffles 400. The ionizing unit 500 may be located before the baffles 400 or between two sets of baffles 400. The ionizing unit preferably emits UV radiation. As such, the ionizing unit 500 is preferably corona type, such as corona wires or electrodes. Some corona designs are described at U.S. Pat. Nos. 4,718,072, 5,337,330 and 5,719,896, and U.S. patent application Ser. Nos. 09/247,887 and 09/692,265, each application being assigned to the same assignee as the present application, all of which are hereby incorporated by reference.

The UV light from the ionizer unit 500 ionizes dust particles that tend to travel along with the beam. An electrostatic particle filter 600a, 600b is provided for collecting the charged dust particles resulting in a cleaner beam path. Fewer of these contaminants are deposited on the window 18 and elsewhere in the chamber 14. Also, the ionizer/precipitator arrangement reduces reflections from the particulates by the EUV beam, as well as other disturbances to the beam.

An EUV source has been described with reference to FIG. 9 which provides an improved EUV photon source, particularly having output emission characteristics more suitable for photolithographic applications. The clipping aperture and set of baffles reduce the influence of acoustic waves emanating from the pinch region 12. The clipping aperture also matches the divergence of the beam. The prepulse generated prior to the main pulse serves to homogenize the plasma shell to reduce the probability that arcing will degrade the pinch symmetry and the resulting EUV beam and that hotspots due to the arcing will deteriorate the electrodes 30, 32. The ionizer 500 and precipitator 600a, 600b serve to remove particulates from the beam path preventing adverse effects on the beam and components such as the beam exit window 18 of the chamber 10 where the particulates may become otherwise deposited.

FIGS. 10–13 schematically illustrate additional embodiments and/or alternative features that may be combined with the above-described preferred embodiments. The embodiments of FIGS. 10–13 relate generally to use of a multilayer mirror to increase the usable angle in gas discharge based photon Sources (e.g., Z-pinch (FIG. 10), HCT-pinch (FIG. 11), capillary discharge (FIG. 12) and plasmafokus or plasma focus (FIG. 13)). Generally, the mirror could be flat or may have a curved shape with imaging properties, preferably installed in a gas discharge EUV photon source.

Advantageously, the output power of gas discharge based photon sources in the extreme ultraviolet and soft x-ray spectral range may be increased using a mirror according to these alternative embodiments. Another advantage is that this effect of increased power may be obtained while leaving other conditions unaltered.

The usable angle of a gas discharge based photon source is often limited by the electrodes of the discharge system itself. Furthermore, it is often difficult to increase the aperture.

Another way to raise the output power of gas discharge based photon sources, the electrical input power may be increased. Under the same discharge conditions, this leads to higher power in the electrode system correlated with higher temperatures. The preferred embodiments which include the multilayer mirrors increases the output power of such a source leaving other parameters such as input power unaltered.

Gas discharge based photon sources generate a hot dense plasma, which emits radiation into a solid angle of $4\pi$ sr. Radiation emitted in an other direction than the open solid angle of the electrode system, which is defined by the aperture and its distance to the plasma, is absorbed within the source and cannot be used. The described mirror reflects parts of this radiation and guides it through the accessible aperture. The mirror is preferably a multilayer mirror, which is adapted to the wavelength of the radiation (preferably between 11 nm and 15 nm) and the angle of incidence. This angle can vary laterally on the surface of the mirror and gradient multilayers may be used.

In the gas discharges of the systems schematically illustrated at FIGS. 10–13, the generated plasma generally has the shape of a small column (e.g., less than 1 mm, such as around 0.53 mm). The optical thickness along the symmetry axis for the emitted radiation is typically high. The reflected radiation does not pass through the plasma itself due to the opaque nature of the plasma. The shape of the mirror is adapted to the emission characteristic of the source. The imaging properties of the mirror are such that a substantial amount or even most of the reflected radiation is guided apart from the plasma column to the open aperture of the electrode system.

A flat mirror will improve the output power of the source, and may be useful with some configurations. To improve the output power further, an elliptical mirror with adapted focal length will focus the radiation in front of the output aperture, and a hyperbolic mirror will generate almost parallel radiation. This degree of freedom of changing the mirror shape to adapt the emission properties of the source to the optical system of the application may be advantageously used.

The improvement of the output power of the sources, e.g., those illustrated at FIGS. 10–13, by consideration of the geometry of the electrode systems is described in Table 1 below. The solid angle (in steradians or sr.) of the emitted radiation is understood from recent publications. In table 1, IO is the intensity emitted isotropically by the plasma into a solid angle of $4\pi$ sr. The output is calculated out of these two values. The estimated mirror acceptance angle is the upper value, limited by the electrode systems. The reflectivity of the mirrors is set to 70% close to the best demonstrated values from literature for normal incidence radiation. The increase of output is calculated by multiplication of the solid angle of the mirror and its reflectivity. The "improvement" value in table 1 is the quotient of the increase of output and the initial output of each source. The highest increase of the output power is expected for the z-pinch and HCT-pinch geometries illustrated at FIGS. 10 and 11, respectively. The usable angles of capillary discharges and plasmafocus devices, illustrated at FIGS. 12 and 13, respectively, initially are very high such that the expected improvement according to these preferred embodiments is smaller in relation to the output power than for the z-pinch and HCT-pinch arrangements, as shown in Table 1.

TABLE 1

| Source/Parameter | z-pinch | HCT-pinch | Capillary discharge | Plasmafocus |
|---|---|---|---|---|
| solid angle | 0.3 sr | 1 sr | $\pi$sr | 2 $\pi$sr |
| Output IO | 0.3/4 $\pi$ IO | 1/4 $\pi$ IO | $\pi$/4 $\pi$ IO | 2 $\pi$/4 $\pi$ IO |
| Estimated mirror acceptance angle | 1 sr | 1 sr | 0.3 sr | 1 sr |
| Multilayer reflectivity | 70% | 70% | 70% | 70% |

TABLE 1-continued

| Source/Parameter | z-pinch | HCT-pinch | Capillary discharge | Plasmafocus |
|---|---|---|---|---|
| Increase of output by mirrow | 1/4 π × .07 IO | 1/4 π × .07 IO | 0.3/4 π × .07 IO | 1/4 π × .07 IO |
| Increase output in % of IO | 5.6% | 5.6% | 1.7% | 5.6% |
| Expected improvement | 230% | 70% | 6.8% | 11.2% |

The preferred mirrors are treated by heat and/or ion bombardment from the plasma of the devices shown in FIGS. 10–13. This may shorten the lifetime of the mirror. Special heat resistant kinds of multilayer systems can be advantageously used for these mirrors, e.g., $Mo_2C$—Si or Mo—Si—$Mo_2C$ combinations. In general, the mirrors may be formed from silicon/beryllium and/or molybdenum/silicon multilayers.

Those skilled in the art will appreciate that the just-disclosed preferred embodiments are subject to numerous adaptations and modifications without departing from the scope and spirit of the invention. Therefore, it is to be understood that, within the scope and spirit of the invention, the invention may be practiced other than as specifically described above.

I claim:

1. A detector for use with an EUV photon source emitting around 11–15 nm, comprising:
  a beam separating element for separating generated EUV radiation at around 11–15 nm into a first beam component and a second beam component, the beam separating element arranged to pass the second beam component to an application process;
  at least one multilayer mirror for reflecting the first beam component along an optical path;
  a filter positioned along the optical path for reducing the bandwidth of the first beam component; and
  a detector element positioned along the optical path for detecting the first beam component and generating electrical signals in response thereto, the detector element connected to transmit the electrical signals to a processor for monitoring the first beam component, whereby the processor uses a known relationship between the first and second beam components to determine a status of the second beam component.

2. The detector of claim 1, wherein the filter is a stand alone foil.

3. The detector of claim 1, wherein the filter is directly deposited onto the surface of the detector element.

4. The detector of claim 1, wherein the detector element includes a photodiode.

5. The detector of claim 1, wherein the detector element includes a CCD camera.

6. The detector of claim 1, wherein the detector element is disposed in a detector element module that is attachable to and detachable from other components of the detector.

7. The detector of claim 6, wherein the other components include a component module having the multilayer mirror therein.

8. The detector of claim 7, wherein the component module also includes the filter therein.

9. The detector of claim 7, wherein the detector includes at least two multilayer mirrors and each is disposed within the component module.

10. The detector of claim 1, wherein the at least one multilayer mirror includes at least two multilayer mirrors.

11. The detector of claim 1, wherein the detector element comprises a PtSi-nSi barrier for increasing the long term stability of the detector element.

12. The detector of claim 1, wherein the detector element comprises a Si pn diode with a doped dead region and zero surface recombination for increasing the long term stability of the detector element.

13. The detector of claim 1, wherein:
  the second beam component is passed to an application process for processing a workpiece, wherein monitoring the first component provides information regarding the processing of the workpiece.

14. An EUV exposure source system, comprising:
  an EUV exposure source including a mirror for focusing generated EUV radiation to an output aperture for increasing the power of the radiation output at the aperture;
  at least one flat, multilayer mirror for reflecting the EUV radiation at around 11–15 nm along an optical path; and
  a detector including a detector element which comprises a PtSi-nSi barrier for increasing the long term stability of the detector element, wherein the detector further comprises a filter for reducing the bandwidth of the radiation incident at the detector element.

15. The EUV exposure source system of claim 14, wherein:
  the detector is operable to detect the EUV radiation and generate electrical signals in response thereto, the detector element transmitting the electrical signals to a processor for monitoring the EUV radiation.

16. A detector for use with an EUV photon source emitting around 11–15 nm, comprising:
  a beam separating element for separating EUV radiation at around 11–15 nm into a first beam component and a second beam component;
  a multilayer mirror for reflecting the first beam component along an optical path;
  a filter for reducing the bandwidth of the first beam component; and
  a detector element positioned along the optical oath for detecting the first beam component and generating electrical signals in response thereto, the detector element operable to transmit the electrical signals to a processor for monitoring the EUV radiation.

17. A detector for use with an EUV photon source emitting around 11–15 nm, comprising:
  a multilayer mirror for reflecting generated EUV radiation around 11–15 nm along an optical path;
  a filter for reducing the bandwidth of the generated EUV radiation;
  a detector element positioned along the optical path for detecting the EUV radiation and generating electrical signals in response thereto, the detector element operable to transmit the electrical signals to a processor for monitoring the EUV radiation; and
  a beam separating element for separating the generated EUV radiation into a first beam component and a second beam component;
  wherein the beam separating element passes the second beam component to an application process and directs the first beam component toward the multilayer mirror.

18. The detector of claim 17, wherein:
  a known relationship exists between the first beam component and the second beam component, such that when the first beam component is detected by the detector element the detector element transmits the electrical signals to a processor for monitoring the first beam component, whereby the processor uses the electrical signals and the known relationship to determine a status of the second beam component.

* * * * *